United States Patent [19]

Tsukiyama et al.

[11] Patent Number: 4,872,009
[45] Date of Patent: Oct. 3, 1989

[54] METHOD AND APPARATUS FOR DATA COMPRESSION AND RESTORATION

[75] Inventors: Tokuhiro Tsukiyama; Hiroshi Yashiki, both of Kanagawa; Osamu Hirose, Odawara, all of Japan

[73] Assignees: Hitachi, Ltd.; Hitachi Computer Peripherals Co., both of Tokyo, Japan

[21] Appl. No.: 129,186

[22] Filed: Dec. 7, 1987

[30] Foreign Application Priority Data

Dec. 12, 1986 [JP] Japan .................. 61-294826

[51] Int. Cl.4 ............................................ H03M 7/30
[52] U.S. Cl. ...................................... 341/95; 341/51; 360/48
[58] Field of Search .................. 340/347 DD; 341/51, 341/55, 59, 87, 95, 106; 358/261.1, 261.2; 360/39, 40, 48

[56] References Cited

U.S. PATENT DOCUMENTS 4,558,302 12/1985 Welch .......................... 340/347 DD
4,586,027 4/1986 Tsukiyama et al. .......... 340/347 DD
4,701,745 10/1987 Waterworth ..................... 341/95

*Primary Examiner*—William M. Shoop, Jr.
*Assistant Examiner*—Brian Young
*Attorney, Agent, or Firm*—Kenyon & Kenyon

[57] ABSTRACT

A method of data compression for recording data on a recording medium such as magnetic tape, a method of data restoration for data which has been compressed for recording, and an apparatus of data compression and restoration prescribe the data to be compressed based on type or value and encode the compression object data, thereby reducing the number of bits necessary to indicate the compression object data. Compression is implemented only for consecutive data fewer in number of repeating consecutive bytes than a certain number, thereby reducing the number of bits necessary to indicate the number of bytes of the consecutive data. A compression mark indicative of compression is appended to the compressed data, consisting of data made by encoding the compression object consecutive data and data indicating the number of bytes of the data, either at the front or rear of the compressed data, whereby an input data string can be compressed drastically and compressed data, even including errors, can be restored.

9 Claims, 6 Drawing Sheets

METHOD AND APPARATUS FOR DATA COMPRESSION AND RESTORATION

CROSS-REFERENCES TO RELATED APPLICATIONS:

This application is related to U.S. patent application Ser. No. 129,185 entitled METHOD FOR COMPRESSING AND RESTORING DATA SERIES AND APPARATUS FOR REALIZING SAME filed on Dec. 7, 1987.

BACKGROUND OF THE INVENTION

This invention relates to a method and apparatus for data compression and restoration, and particularly to a method and apparatus for data compression and restoration applicable to sequential file units, such as magnetic tape units, which allow data writing in the forward and reverse directions on a recording medium.

A conventional data compressing method for a magnetic tape memory unit implements data compression using 4-byte dictionary data when the same data is repeated for five, bytes, or more, as described in U.S. Pat. No. 4,586,027. In this method, the dictionary data is made up of a value indicating the distance from the previous dictionary data to the current dictionary data, the number of repetitive data, and a value indicating the distance to the next dictionary data. However, this conventional method does not consider the case of repetitive data of 4 bytes or less included in the input data. The frequency of occurrence of repetitive data of 4 bytes or less is higher by four to 20 times than that of 5 bytes or more, and its occurrence rate as the whole is as high as 10%, resulting in the difficulty in improving a compression factor. Another problem is that if an error arises even once in the dictionary data during the restoration process, restoration for subsequent data is not guaranteed.

SUMMARY OF THE INVENTION

An object of the present invention is to provide a method and apparatus for data compression and restoration which enhances the compression factor.

Another object of the present invention is to provide a method and apparatus for data compression and restoration operative, when erroneous compressed information (dictionary information) exists, to correctly restore data following the erroneous compressed information.

The above objective are achieved as follows.

Due to the fact that there are only a limited number of types of computer data to be compressed occurring repetitively in 2 bytes or more at a high occurrence rate, the number of types of data to be compressed is confined to a limited number and the data to be compressed is encoded, thereby reducing the number of bits necessary to represent the data to be compressed, also, due to the fact that the number of bytes of repetitive data with high occurrence rate is within a certain range in most cases, only repetitive data with less than a certain number of bytes is made the object of compression, thereby reducing the number of bits for indicating the number of bytes of consecutive data. Namely, the compression factor is improved by reducing the number of types, among those constituting compressed data (dictionary data), for indicating the type and number of bytes of repetitive data. This scheme is called "compression method 1" in the following discussion.

In the case where the number of bytes of repetitive data is greater than a certain value or in the case where data of other types than that of the confined compression data has a high consecutive occurrence rate, the compression factor can be further improved by increasing the number of bytes for indicating the type of object data in the dictionary data and the number of bits or bytes for indicating the number of bytes of consecutive data. This scheme is called "compression method 2" in the following discussion.

Furthermore, information (compression mark) indicative of the above method 1 or 2 is appended at either the front or rear of each compressed data. The compression information exists independently in units of compression mark, and therefore even if erroneous compression information is encountered during the data restoring operation, subsequent data reproduction is facilitated through the detection of the compression information based on the unique compression mark without being affected by other compression information.

DETAILED DESCRIPTION

Figure 1:
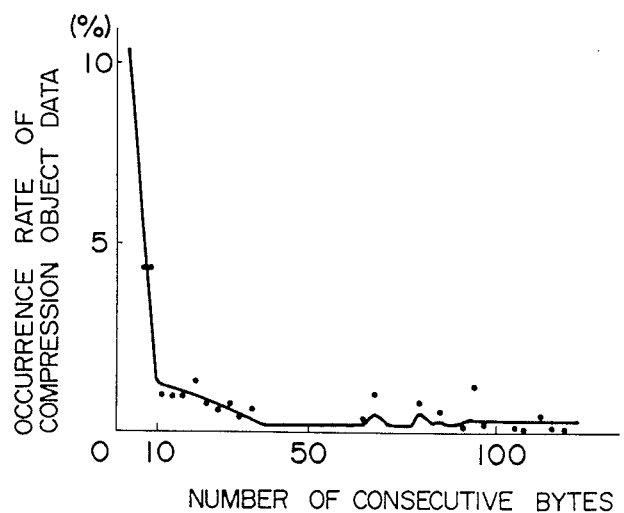
FIGS. 1 and 2 are diagrams used to explain the data compression factor with respect to the number of consecutive bytes and data type.
Figure 2:
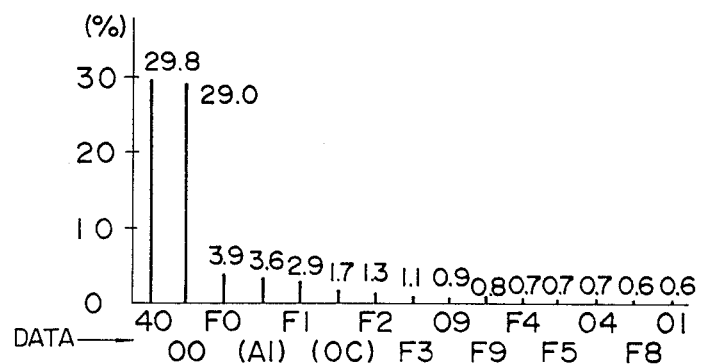

Before entering into a description of the embodiments of the invention, the principle will be explained with reference to the drawings. Among information dealt with by computers, frequently used characters and special symbols are confined in a certain range of variety, and their occurrence rate with respect to the consecutive repetition is inversely proportional to the number of repetition. Shown in FIG. 1 is the percent occurrence rate plotted against the number of bytes of consecutive data. FIG. 2 shows an example of the occurrence rate for the high occurrence data sampled in magnetic tapes used in various kinds of businesses. In computer data, the occurrence rate against the number of bytes is higher in inverse proportion to the number of consecutive bytes, as shown in FIG. 1, and specific types of data occur frequently as shown in FIG. 2. This invention is based on this nature, and intended to represent the number of bytes for indicating the repetitive data using 4 bytes by choosing 16 high occurrence data, for example. The byte length for indicating the number of consecutive bytes is set to 4 bits based on the fact that the number of consecutive bytes is mostly smaller than 10. This scheme enables consecutive data of 16 bytes or less to be compressed to 1 byte. In addition, data carrying only the compression mark indicative of the type of compression mentioned above is also included in the compressed data. This mark is used to indicate the position of compression information in the data restoring operation. The compression mark is appended at either the front or rear of data after compression.

With this arrangement, data restoring operation in the forward and reverse feed directions of the recording medium is performed on the basis of the detected compression mark.

Embodiments of the invention will now be described with reference to the drawings.

Figure 3:
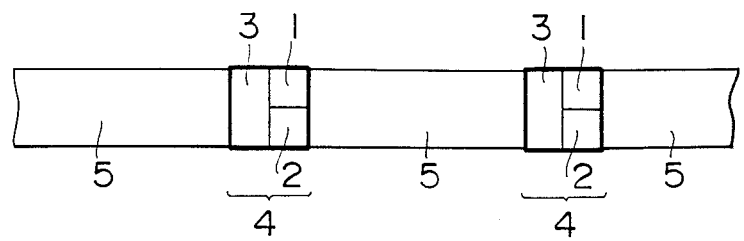
FIGS. 3 through 5 are diagrams used to explain the recording format of compressed data on the magnetic type.
Figure 4:
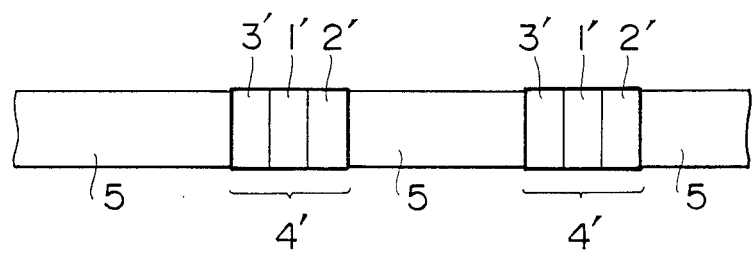

FIG. 3 shows the data format after the compression process according to one embodiment of the invention, and the format is made up in combination of non-compressive data 5 and compression information (dictionary information) 4. The compression information 4 includes a compression data code (4 bits) after compression, a count value 2 (4 bits) indicating the number of continuous data blocks which are compressed, and a compression mark 3 (1 byte) indicating the compression mode of the compressed data, to the total of 2 bytes in this case. FIG. 4 shows another example of compression information 4', in which the counterparts of the above information (compression data code 1', count value 2' and compression code 3') are expressed by 1 byte each, to the total of 3 bytes in this case. Both of these types of compression information may be mixed in recording, as shown for example in FIG. 5.

Figure 6:
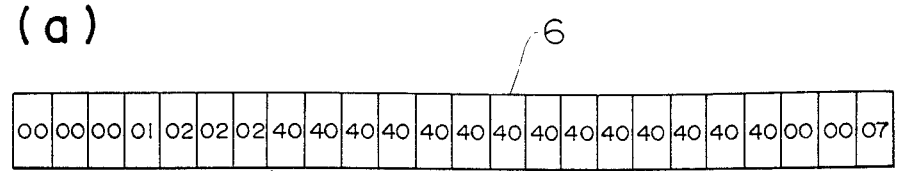
FIG. 6 is a diagram showing the recording data format on the magnetic tape before and after compression.
Figure 7:
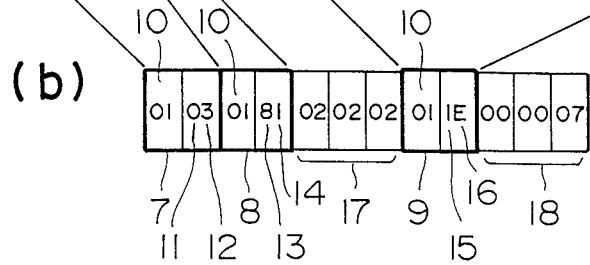
FIG. 7 is a diagram showing the condition of data compression.

FIG. 6 shows an example of data compression using the data format shown in FIG. 3. The data before compression is indicated by (a), while that after compression is indicated by (b). The data shown at (a) is constituted by a plurality of 1-byte data blocks such as "00", "01", "02" and the like. FIG. 7 shows the condition of data compression. The condition table is based on the assumption that the compression data code 1 is 4 bits, the compression data count value is 4 bits so that it can indicate up to 15 bytes, and the compression mark is made to have a compressed data value of "01".

In a source data 6, compressible data blocks are those among the compression object data listed in the table of FIG. 7 and are of the case where such compression object data blocks continue for 3 bytes or more. (Data of the same value "01" as the compression mark is allowed to generate a dictionary pattern, even though it is 1 byte, and "01" data among the source data identical to the compression mark is converted to different data, with the intention of differentiating data after compression from the compression mark.) Accordingly, in FIG. 6 the leading 3 bytes of "00" data, the following "01" data, and 14 bytes of "40" data are to generate compressed dictionary patterns. The compression mark 10 of the dictionary pattern 7 is a piece of "01" data, and the compression data code (i.e. code representing the data to be compressed) 11 is "0" (HEX), as derived from FIG. 7. The compression data count value 12 becomes "3" representing 3 byte data "00", resulting in the 1-byte data of "03". Subsequently, "01" data identical to the compression mark is made to have "8" for the compression data code 13 according to FIG. 7, as indicated by the dictionary pattern 8 shown in FIG. 6(b), and the compression data count value 14 is made "1" because of its 1-byte source data, resulting in the 1-byte data of "81" shown in FIG. 6(b).

Next, 3 bytes of non-compressive data 02, 02, 02 are recorded, and the next dictionary pattern 9 is created. Information "1" of the compression data code 15 and information "E" of the compression data count value 2 are recorded in the same way as described. The subsequent noncompressive data "00", "00" and "07" are recorded also in the same way as above. Through the foregoing process, the compressed data shown by (b) in FIG. 6 can easily be completed. Also for the compression format of FIGS. 4 and 5, compressed data can be provided in the same way.

Next, the method of data restoration by reading out the compressed data shown by reference numeral 6 in FIG. 6 in the forward and reverse directions will be described. Forward reading is the case of reading in the order of compression mark and compression information, while reverse reading is the case in the order of compression information and compression code. First, an embodiment of the method of data restoration by the forward reading will be described.

The first read-out data "01" is recognized to be the compression mark, and therefore it is known that the next byte is a byte of compression information. When this compression information has been read, the compression data code 11 is "0", which reveals by the reverse conversion of the table in FIG. 7 that compressed object data has been "00" and, at the same time, the compression data byte count value is "3", which reveals that there exist 3 bytes of compressed data. Accordingly, consecutive 3 bytes of "00" data can be restored from the first 2 bytes. In this way, each time the compression mark is detected, data is restored, and eventually the source data 6 is restored.

Next, an embodiment of the method for data restoration by the reverse reading of the compressed data shown in FIG. 6 will be described. Each time a piece of data is read out in the reverse direction, it is checked for the compression mark and, at the same time, dictionary pattern information is stored temporarily in the register. Namely, data is read out in the reverse direction of "07", "00", "00", "1E", and "01", and when the compression mark 9 "01" is detected, it is known that the previous byte is compression information. From the compression information "1E" held in the register, value "1" of the compression data code 15 is determined to be a piece of data "40" based on FIG. 7, and from value "E" of the compression data count value 16, it is revealed that 14 bytes of consecutive data has been compressed. Consequently, the source data "07", "00", "00", "40", "40" and so on are restored also by reverse reading.

Figure 5:
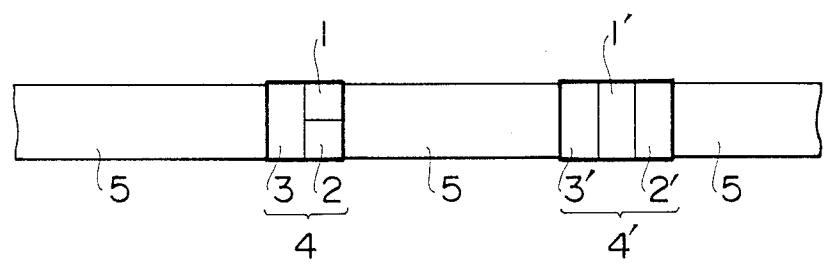

In restoration of data shown in FIGS. 4 and 5, the arrangement of compression information is recognized based on the compression marks 4 and 4', respectively, and data restoration is possible as in the previous case.

Figure 8:
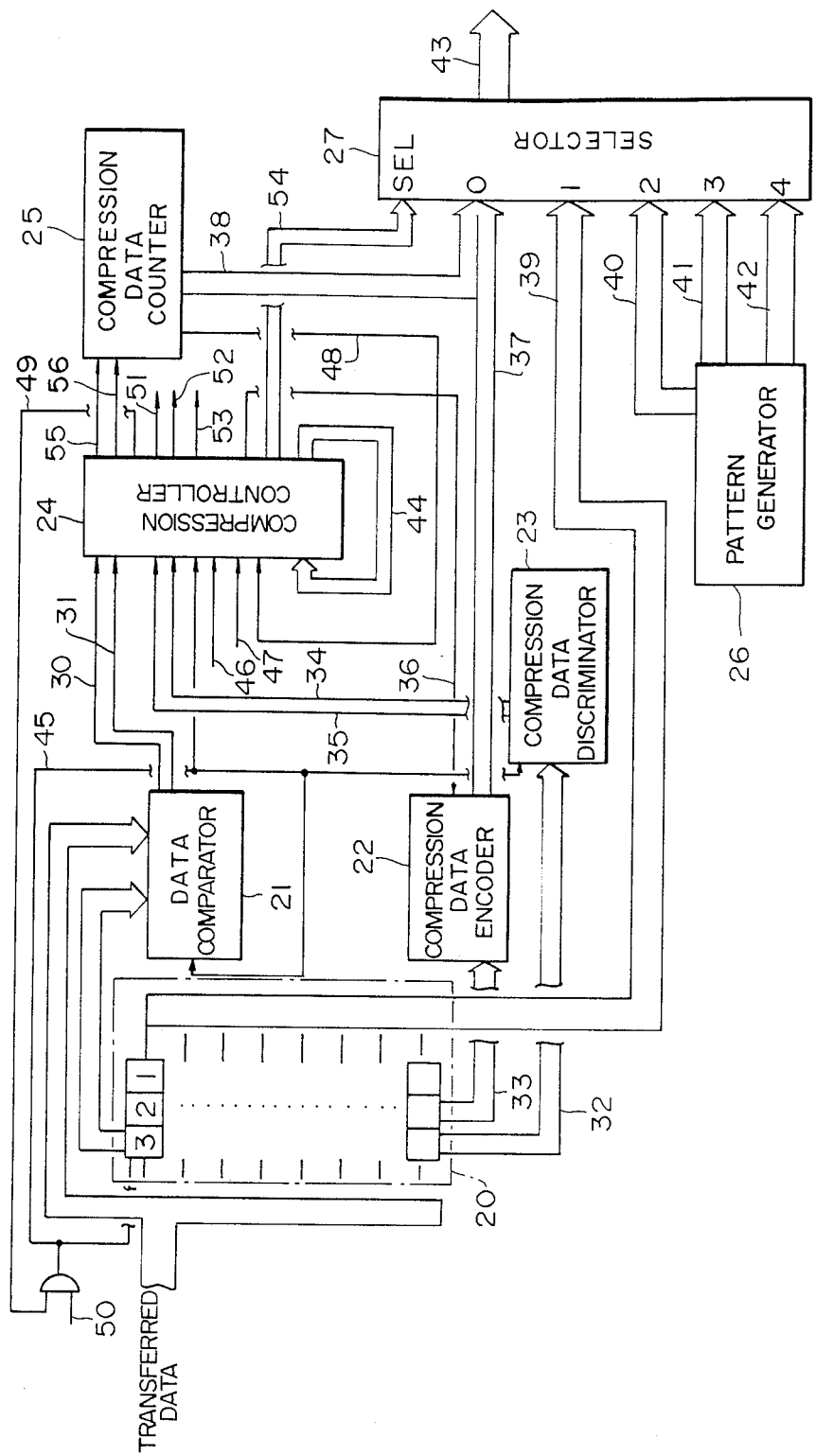
FIG. 8 is a block diagram of a data compression circuit embodying the present invention.

FIG. 8 shows in block diagram an embodiment of data compression circuit useful for the inventive data compression and restoration apparatus. The data compression circuit functions to produce compressed data 4 (i.e., 7, 8, 9 and the like shown by (b) in FIG. 6) from data 6 as shown by (a), and this example is the case of the dictionary pattern 4 in 2 bytes. In FIG. 8, serial data is transferred from a high ranking unit such as a magnetic tape unit.

In the arrangement of FIG. 8, the in-buffer circuit 20 consists of a 3-stage buffer (the number of stages of buffer is derived from the value n which has been set by determining that n or more bytes of consecutive data are compressed), and it temporarily stores the data until decision is made as to whether the input data is to be compressed. The data comparison circuit 21 tests that the transferred data stored in the in-buffer circuit 20 are the same. Each byte of transferred data, when stored in the in-buffer circuit 20, produces an output (CMP 12) on the signal line 30 if the first and second bytes of data in the in-buffer circuit 20 are consistent, as tested by the comparison circuit 21. Each byte data produces an output (CMP 23) on the signal line 31 if the second and third bytes of the data are consistent. The compression data check circuit 23 reads on the bus 32 information held in the in-buffer circuit 20 as the third byte of the in-buffer circuit 20, examines whether it is a piece of compression object data in response to the timing signal for reading the next transferred data. In case of data to be compressed, the circuit 23 indicates to the signal line 35 that it is a piece of compression object data. In this case, if the data is identical to the compression mark, the circuit 23 notifies it to the signal line 34. The compression data encoding circuit 22 retrieves information held in the second byte of the in-buffer 20 through the bus 33 at the timing of the control line 36 from the compression control circuit 24, and produces the compression data code 1 which is the compression information. The compression data code 1 produced by the compression data encoding circuit 22 and placed on the bus 37 is merged with the count value of the compression data counter 25, which counts the number of bytes of consecutive data of 3 bytes or more, and is sent as a 1-byte compression information to the switching circuit 27. The pattern generator 26 continuously provides the compression mark to the bus 40, and if data identical to the compression mark 1 is 1 byte, a 1-byte compression information consisting of the compression data code 1 produced by encoding the above data and the compression data count value 2 is outputted continuously to the bus 41, and if data identical to the compression mark is 2 bytes, a 1-byte compression information consisting of the compression data code 1 and the compression data count value 2 is outputted continuously to the bus 42. The switching circuit 27 is such that information on the bus 39 of input 1 of the switching circuit 27 for the non-compressive data 5, information on the bus 40 of input 2 of the switching circuit 27 for the compression mark 3, compression information of the bus 37 and bus 38 of input 0 of the switching circuit 27 for compression data of 3 bytes or more, or compression information etc. on the bus 41 of input 3 or on the bus 42 of input 4 of the switching circuit 27 when the same data as the compression mark of 2 bytes or less or is transferred, is outputted selectively on the bus line 43 in the compression format shown in FIG. 3, thereby producing compressed data.

The compression control circuit 24 is a control circuit for making compressed data from the transferred data, and it forms a sequencer.

The transferred data is stored in the in-buffer 20 at the timing of the timing signal 50 for the transferred data, and at the same time the data comparison circuit 21 continuously checks the continuity of data (i.e., repetition of the same data), so that the state in the in-buffer circuit 20 is known from information on the signal line 30 and signal line 31. For the data stored in the in-buffer circuit 20, when the number of occurrence of signals generated on the signal line 45 which carries the signal representing the timing of transferred data has been counted from 1 byte to 3 bytes by the sequence counter information 44 of the compression control circuit 24, it is judged, based on the states of the signal lines 30 and 31 and the output signals 34 and 35 of the compression data check circuit 23 as to whether the data on the bus 39 is to be compressed. If the signal 35 is not issued, the selection signal 54 selects input 1 to send the non-compressive data on the bus 39 at the transmission timing of the signal line 51 regardless of the states of the signal lines 30 and 31. When the signal 35 is outputted, with the signal 34 being off, the compression control circuit 24 first initialize the compression data counter 25 to value 3 in response to the LOAD signal of the signal 56 and subsequently stores data of the fourth byte in the in-buffer circuit 20 at the timing of the signal 45 in order to compress the transferred data. At the same time, the compression control circuit 24 selects information of compression mark which is input 2 of the switching circuit in response to the selection signal 54, and transmits the compression mark on the bus 40 at the timing of the signal 51. At the same time, the compression data counter 25 is upcounted at the timing of the signal 55. The compression data counter 25 is up-counted in the same manner when consecutive data is transferred successively.

At this time, when the count value of the consecutive data reaches the prescribed value (15 in this embodiment), a signal 48 is produced by the compression data counter 25, and the compression control circuit 24 selects input 0 of the switching circuit 27 by the selection signal 54 and sends out the compression information 37 and 38 at the transmission timing of the signal 51. At the same time, the sequence count information 44 of the compression control circuit 24 is brought to 0, and the compression information 37 and 38 for consecutive data is produced by the iteration of the above operations. When the compression control circuit 24 recognized that the signal line 31 (CMP 23) is off before the compression data counter 25 has reached the specified value, it sends out the compression information 38 and 37 at the timing of next data fetching in the same way as above. At this time, data different from the consecutive compression object data preceding by one byte is located at the first byte of the in-buffer circuit 20, and therefore the sequence count information 44 of the compression circuit 24 is left in the state of indicating the full state of the in-buffer circuit 20, and the signal lines 30, 31, 34 and 35 are checked and the same operation as above is repeated. When both the signal lines 35 and 34 are outputted, the switching circuit 27 selects an input based on the information of signal 30 (CMP 12) and signal (CMP 23) as follows. When both the signals 30 and 31 are off, the same data as the compression mark is present only one byte on the bus 39, and therefore the compression control circuit 24 issues a signal 52 so that the high ranking unit does not send data, and subsequently select input 2 of the switching circuit 27 by the selection signal 54 and issues the transmission timing signal 51, and turns off the signal 52. Next, the circuit 24 receives transferred data at the timing of receiving the next transferred data, and it selects input 3 of the switching circuit 27 and transmits the compression information on the bus 41 representing the presence of 1 byte of data identical to the compression mark by the transmission timing signal 51. Similarly, when the signal line 30 is on and the signal line 31 is off, indicating the presence of two pieces of same data as the compression mark, the circuit 24 selects input 2 of the switching circuit 27 in synchronism with the timing of the next transferred data to send the compression mark, and thereafter selects input 4 to send the compression information on the bus 42 representing the presence of two pieces of same data as the compression mark.

Compressed data is produced continuously through the same operation, and when the transfer of data from the high ranking unit has completed, the high ranking unit generates a data stop signal 46. In response to this signal, the compression control circuit 24 generates a sub-request signal 49 which is a shift signal to the circuit 20, in order to send data remaining in the in-buffer circuit 20, and when all data has become vacant, which means the completion of compressed data transmission, the signal 53 produces the compressed data stop signal to terminate the compression process.

The signal 47 is generated when the system requires a low granting unit to suspend temporarily the transmission of data, and the compression control circuit 24 responds to this signal to halt the operation while retaining the operation of the compression circuit in the current state.

The method shown in FIG. 4 is also made possible easily by practicing it in the same way as the previous one.

Figure 9:
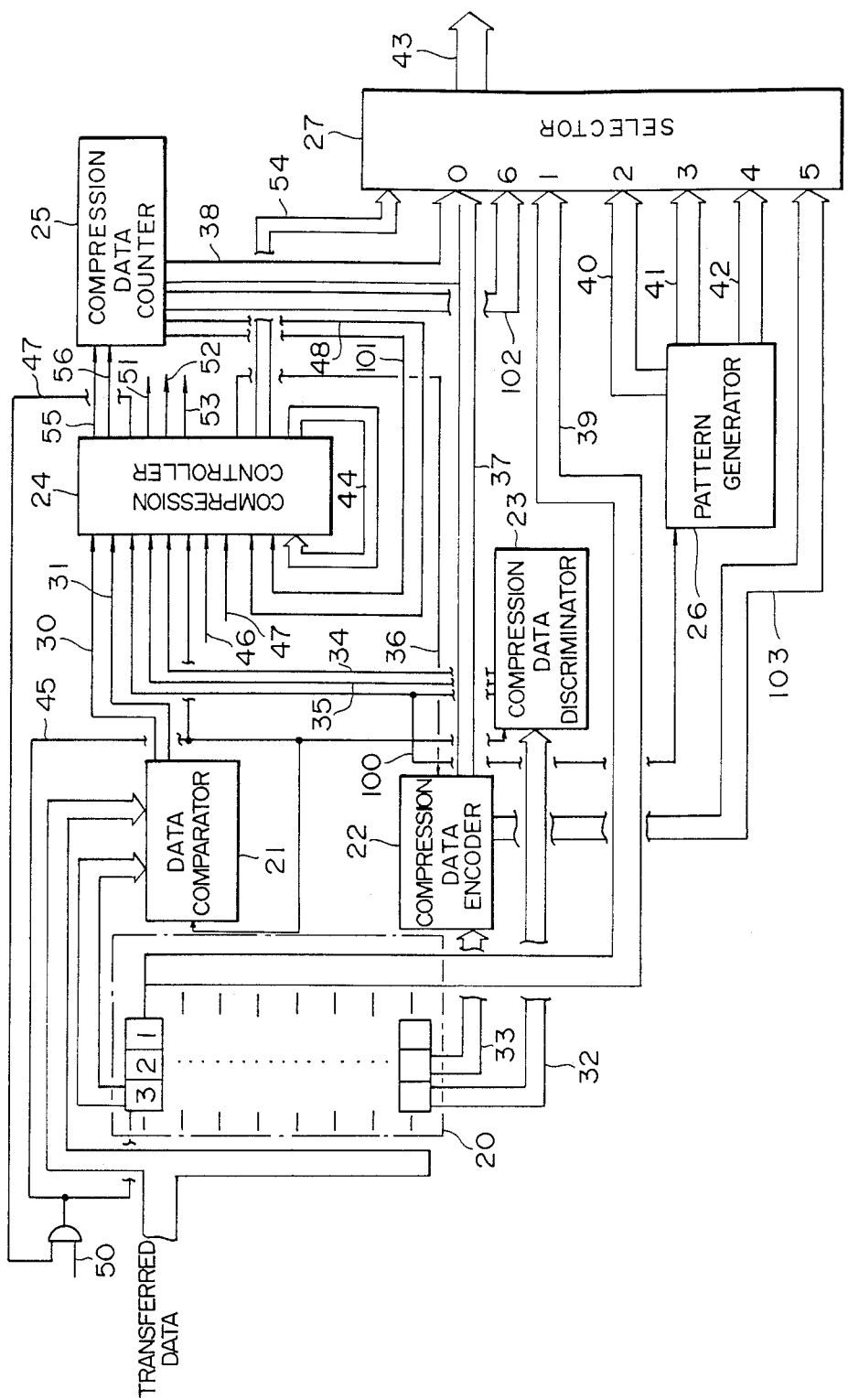
FIG. 9 is a block diagram of a data compression circuit according to another embodiment of the present invention.

FIG. 9 shows the circuit arrangement of the data compression apparatus which is an embodiment of this invention for implementing data compression based on the combinational method shown in FIG. 5. This circuit is basically the same as that shown in FIG. 8, with the addition of a compression object data signal line 100, signal lines 101 for the increased maximum value of compressed data count value, a bus 102 for indicating this value in 1 byte, and a bus 103 for expressing the compression data code in 1 byte, and it can readily be practiced by switching arbitrarily the selection signal 54 of the compression control circuit 24 depending on the difference of the dictionary pattern so as to select an input information of the switching circuit 27.

Figure 10:
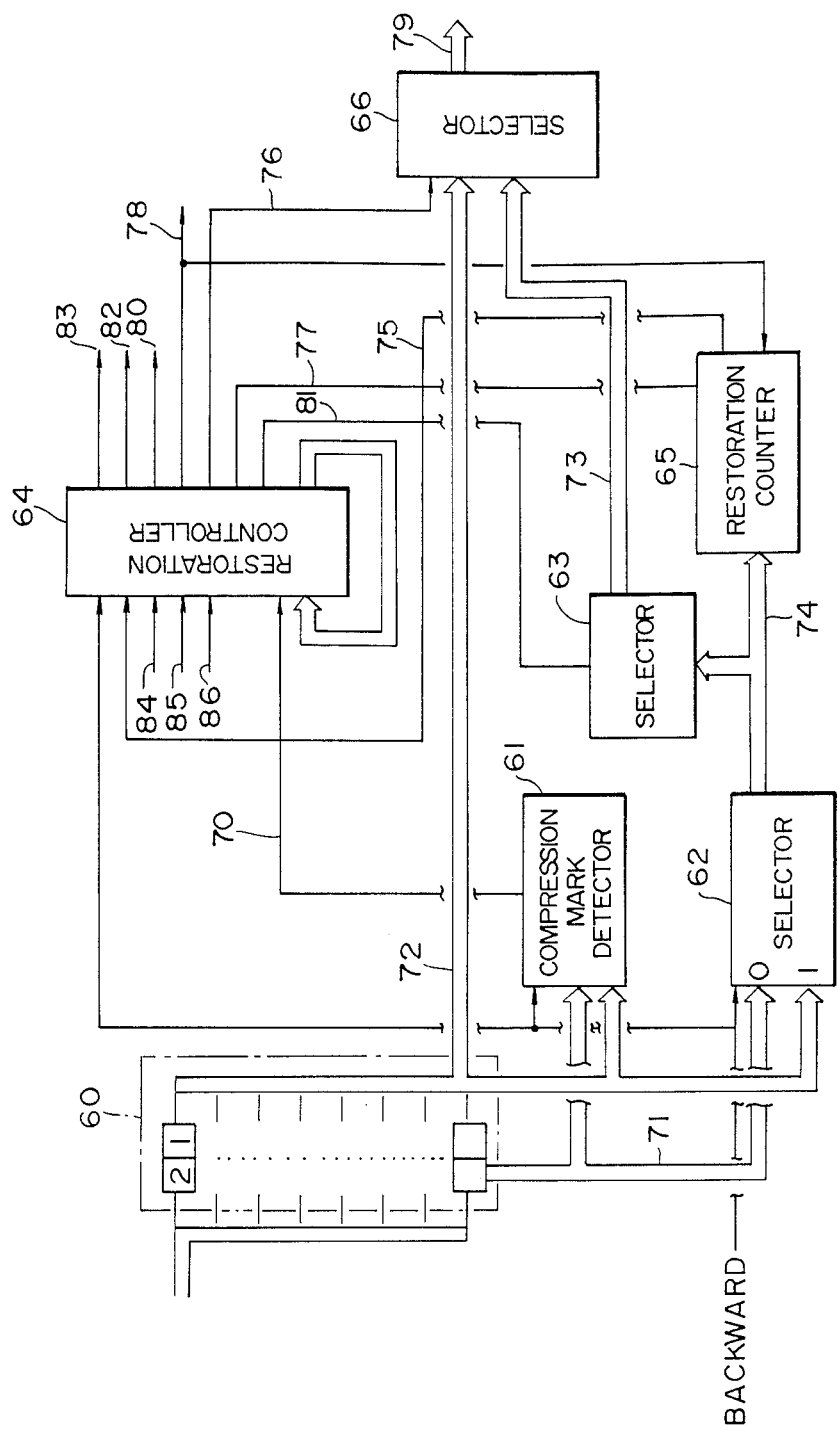
FIG. 10 is a block diagram of the data restoration circuit embodying the present invention.

FIG. 10 shows in block diagram an embodiment of the data restoration circuit of this invention, and it implements the restoration of data which has been compressed in the data format by the data compression circuit shown in FIG. 8.

In the data restoration circuit shown in FIG. 10, compressed data which has been read is all stored in the read-out data buffer 60 and the compressed data is sent out as transfer data from the read-out data buffer 60, and the compressed data is restored and outputted as transfer data under control of the restoration control circuit 64.

First, the operation of each circuit section will be described. The read-out data buffer 60 holds the read-out compressed data, and places the first byte of data on the bus 72 s that it is sent to the compression mark detection circuit 61, switching circuit 62 and switching circuit 66. The second byte of data is placed on the bus 71 and sent to the compression mark detection circuit 61 and switching circuit 62. The compression mark detection circuit 61 decodes data on the bus 72 at reading in forward direction, and in the case of the compression mark, activates the signal line 70 to indicate to the restoration control circuit 64 that a dictionary pattern 4 is held in the read-out data buffer 60, and at the same time halts data reading temporarily and enters into the restoring operation. The switching circuit 62 checks the data read-out direction, and, when a dictionary pattern is held in the read-out data buffer 60, selects bytes which include the compression data code 1 and compression data count value 2 and sends them to the bus 74. The decoder 63 decodes the compression data code 1 in the data placed on the bus 74 as selected by the switching circuit 62 to restore only one byte and records it in the internal buffer, and further outputs the recorded restored data to the bus 73. The restoration counter 65 fetches the compression data count value 2 from the bus 74 at the timing of the load signal 77 from the restoration control circuit 64, down-counts the value in synchronism with the output timing signal 78 in the restored data, and, when the value has reached zero, activates the signal line 75 to indicate the end of restoration for the compressed data to the restoration control circuit 64. The switching circuit 66 is a selector circuit which operates in accordance with the switching signal 76 from the restoration control circuit 64 to output data on the bus 72 when the first byte in the read-out buffer 60 is non-compressive data 5, or to output only the compression data count value in the data on the bus 73 restored by the decoder 63. The restoration control circuit 64 is informed by the signal line 70 whether the data read in the read-out data buffer 60 is a dictionary pattern or non-compressive data, and, in case of non-compressive data, selects the output on the bus 72 in response to the switching signal 76 and outputs a strobe signal 78 which indicates the validity of data outputted on the bus 79. In the case where the data in the read-out data buffer 60 is a dictionary pattern 4, the circuit enters into the restoring operation. The restoring operation begins by the restoration control circuit 64 with knowing through the signal line 70 that data in the read-out data buffer 60 is a dictionary pattern, and the circuit 64 activates the signal line 80 so that data transfer is halted. At this time, the compression data code 1 which has already been selected by the switching circuit 62 is present at the decoder 63 through the bus 74. At the same time, the compression data count value 2 is present at the restoration counter 65 via the bus 74. The restoration control circuit 64 activates the restored data latch signal 81 and restoration count value load signal 77 to latch the restored data, and, at the same time, loads the compression data count value. From the beginning of the restoring operation till this time point, the output data strobe signal 78 is kept inactive. Following these preparations, the restoration control circuit 64 activates the output data strobe signal 78 to select the output on the bus 73 using the switching signal 76. At the same time, the restoration counter 65 starts down-counting in synchronism with the output data strobe signal 78. After pieces of restored data equal in number to the compression data count value have been outputted, the restoration counter 65 is cleared and the signal line 75 becomes active to indicate to the restoration control circuit 64 that restoration of the dictionary pattern in the read-out data buffer 60 has completed. After the series of restoring operations has ended, the restoration control circuit 64 deactivates the data transfer halt signal 80 and proceeds to the reading of the next data. These operations are repeated, and data including both of compressive and non-compressive data is restored to the original data. The signal line 82 is the restoration end signal indicating that all data have been restored, signal line 83 is a sub-request signal for pushing out remaining data from the read-out data buffer at the end, signal line 84 is a request signal indicating the arrival of compressed data, signal line 85 is a stop signal indicating the end of transfer of all data, and signal line 86 is a request signal for halting the restoration of data from a low ranking unit.

Data restoration in the reverse direction is also possible in the same way by activating the BACKWARD signal and switching the judgement position for the compression mark.

Restoration is also possible by similar means for data dictionary patterns in 3-byte format and also in 2 or 3-byte format.

What we claim is:

1. A method of transforming an input data string comprising a plurality of data bytes, said plurality including portions of a plurality of consecutive data bytes identical to one another, wherein said data bytes may be of a plurality of types, each type representing different information, said method comprising the steps of:

selecting, in advance, a first subset of the plurality of types of data bytes which may occur, said subset including those data byte types which more frequently appear repetitively and consecutively than those data byte types not included in the first subset;

detecting a compressible portion of the data string when one of said data bytes types of said first subset appears consecutively in the string a certain minimum number of times up to a certain maximum number of times, compressing the compressible portion according to a first compression method, said compression method including encoding the data byte of the compressible portion and counting the number of data bytes of the portion to produce a compressed portion representative of the number and kind of data bytes in the compressible portion;

appending a compression mark byte, which indicates that compression has been affected, either at the front or rear of said compressed portion to generate a first compression information data;

when said input data string contains a third portion consisting of one or more consecutive data bytes the same as a first compression mark byte, said compression step further includes encoding and counting data bytes contained in said third portion to obtain a compressed third portion; and connecting data bytes of said input data string that are not included in said first compressed information data and said compressed third portion, with said first compressed information data and said compressed third portion to produce a compressed output data string.

2. A method according to claim 1, wherein a plurality of compression methods are available and said compression mark byte identifies a type of compression method selected from said plurality of compression methods.

3. An apparatus for transforming an input data string comprising a plurality of data bytes, said plurality including a consecutive portion having a plurality of consecutive data bytes identical to one another and the input data string is formed as a combination of data bytes of a plurality of types, each type representing different information, said apparatus comprising:

means for detecting if a data byte is of a type that corresponds to one of a first subset of data bytes including a first predetermined number of types selected in advance among said plurality of data byte types where said first number of bytes predetermined more frequently occur consecutively and repetitively than other data byte types, means for encoding data bytes of said type corresponding to one of said first subset in accordance with a first transforming format when the data byte of that type appears consecutively a minimum number of times;

means for counting the number of said data bytes constituting said consecutive portion within a certain range of maximum value and for encoding said number;

means for generating a compression mark byte which includes the presence of said encoded data blocks and the encoded number;

means for detecting if the data string includes a portion including one or more consecutive data bytes the same as said compression mark byte;

means for encoding a portion detected to include one or more consecutive data bytes the same as the compression mark byte and for counting the number of bytes of said portion to produce a second compressed portion; and switching means for combining compression information data consisting of said encoded data bytes, the encoded number and compression mark byte with data bytes of said input data string which are not compressed, and with a compressed second portion to thereby produce a compressed output data string.

4. An apparatus according to claim 3 further comprising means which operates on said means for detecting, means for encoding, means for generating and means for switching, for selecting a compression format from a plurality of different formats wherein each format defines a transforming format, a maximum number of consecutive data bytes for compression, and a compression mark.

5. A method of restoring a data string which has been compressed by the method of claim 1, comprising the steps of:

reading out said output data string sequentially in a forward or reverse direction;

restoring, upon detection of said compression mark byte, said compressed information at the front or rear of said compression mark byte to the corresponding data byte depending on the reading direction of said data string, and outputting said restored data block; and outputting said read-out data string directly when said compression mark byte is not detected.

6. A compression/restoration apparatus for transforming an input data string of a plurality of data bytes, which includes a consecutive portion of a plurality of consecutive data bytes identical to one another, and is formed as a combination of data bytes of a plurality of types, each type representing different information, into a compressed output data string, and restoring the original data string, said apparatus including a compression section and a restoration section, said compression section comprising:

means for detecting if the data byte of said consecutive portion corresponds to a data byte which more frequently occurs consecutively and repetitively and corresponds to a data byte type of a first certain number of types selected in advance among said data bytes of a plurality of types;

means for encoding data bytes of said consecutive portion, detected to be data bytes of one of said first number of data byte types selected, in accordance with a first transformation format;

means for counting and for encoding the number of said data bytes which constitute said consecutive portion within the range of a certain maximum value;

means for generating a compression mark byte which indicates that said encoded data bytes and the encoded number are present; and switching means for connecting compression information data consisting of said encoded data blocks, encoded number and compression mark byte to input data from said data string that is without compression, thereby generating a compressed output data string, said restoration section comprising:

means for reading out said output data string;

means for detecting said compression mark byte in said read-out output data string;

encoding means, when said compression mark is detected, for decoding said encoded data bytes located at the front or rear of said compression mark byte and outputting said decoded data bytes consecutively in number equal to the number indicated by said encoded number associated with said consecutive data; and switching means for selecting the output of said decoding means when said compression mark byte has been detected, or the output of said read-out output data string directly when said compression mark byte has not been detected.

7. A method according to claim 1, further comprising the steps of:

selecting a second subset of a plurality of data byte types excluding those belonging to said first subset;

detecting when said input data string contains a fourth portion consisting of a number not less than a fifth predetermined number and not greater than a sixth predetermined number, of consecutive identical data bytes of a type belonging to said second subset;

compressing said fourth portion, said step of compressing said fourth portion including encoding the data byte type of that portion and counting data bytes constituting said fourth portion to obtain a compressed fourth portion representative of the kind and number of the data bytes constituting said fourth portion;

appending a second compression mark byte indicating that compression has been effected on said fourth portion, to one end of said compressed fourth portion, to form a second compression to information data; and connecting data bytes contained in said input data string that are not compressed with said first and second compressed information data and said third compressed portion to produce said compressed output data string.

8. A method according to claim 1, wherein said compressed portion consists of one byte, said first compression mark byte consists of one byte and said first compression information data consists of said one-byte compressed portion and said one-byte first compression mark byte.

9. A method according to claim 7, wherein said compressed fourth portion consists of two bytes, said second compression mark byte consists of one byte and said second compression information data consists of the two-byte compressed fourth portion and the one-byte second compression mark byte.

* * * * *

UNITED STATES PATENT AND TRADEMARK OFFICE
CERTIFICATE OF CORRECTION

PATENT NO. : 4,872,009

DATED : October 3, 1989

INVENTOR(S) : T. Tsukiyama, et al.

It is certified that error appears in the above-identified patent and that said Letters Patent is hereby corrected as shown below:

Column 1, line 34, change "as the whole" to --as a whole--.

Column 1, line 35, change "the difficulty in improving a" to --a difficulty in improving the--.

Column 1, line 50, change "objective" to --objectives--.

Column 1, line 57, change "compressed, also, due to" to --compressed.  Also, due to--.

Column 2, line 29, change "type." to --tape.--

Column 6, line 5, change "initialize" to --initializes--.

Column 6, line 30, change "recognized" to --recognizes--.

Column 6, line 47, between "present" and "only" insert --on--.

Column 7, lne 48, change "72 s that" to --72 so that--.

UNITED STATES PATENT AND TRADEMARK OFFICE
CERTIFICATE OF CORRECTION

PATENT NO. : 4,872,009

DATED : October 3, 1989

INVENTOR(S) : T. Tsukiyama, et al.

It is certified that error appears in the above-identified patent and that said Letters Patent is hereby corrected as shown below:

Column 8, line 24, delete "with" and change "knowing" to --ascertaining--.

Column 9, line 18, change "bytes" to --byte--.

Column 9, line 30, change "affected" to --effected--.

Column 10, line 6, change "includes" to --indicates--.

Column 11, line 14, change "encoding" to --decoding--.

Column 12, line 13, delete "to" after "compression".

Signed and Sealed this

Eleventh Day of December, 1990

Attest:

HARRY F. MANBECK, JR.

*Attesting Officer*  *Commissioner of Patents and Trademarks*